United States Patent
Huat

[19]

[11] Patent Number: 6,156,078
[45] Date of Patent: Dec. 5, 2000

[54] TESTING AND FINISHING APPARATUS FOR INTEGRATED CIRCUIT PACKAGE UNITS

[75] Inventor: Ng Wee Huat, Muar, Malaysia

[73] Assignee: SGS-Thomson Microelectronics Sdn. Bhd., Johor, Malaysia

[21] Appl. No.: 08/152,192

[22] Filed: Nov. 12, 1993

Related U.S. Application Data

[63] Continuation of application No. 07/760,869, Sep. 16, 1991, abandoned.

[51] Int. Cl.⁷ ............................. H01L 21/00; H01L 21/64
[52] U.S. Cl. ............................................................ 29/25.01
[58] Field of Search ................................... 437/925, 926, 437/8; 29/25.01, 742

[56] References Cited

U.S. PATENT DOCUMENTS 4,997,364  3/1991  McGrath et al. ............................ 432/59

FOREIGN PATENT DOCUMENTS

| | | |
|---|---|---|
| 439084 | 7/1991 | European Pat. Off. . |
| 56-101755 | 8/1981 | Japan . |
| 57-54337 | 3/1982 | Japan . |
| 58-18930 | 2/1983 | Japan .................................. 29/25.01 |
| 58-53841 | 3/1983 | Japan . |
| 59-84530 | 5/1984 | Japan . |
| 01554541 | 6/1984 | Japan . |
| 60-52033 | 3/1985 | Japan . |
| 60-63936 | 4/1985 | Japan . |
| 60-63937 | 4/1985 | Japan . |
| 61-30041 | 2/1986 | Japan .................................. 29/25.01 |
| 61-101034 | 5/1986 | Japan . |
| 61-222232 | 10/1986 | Japan . |
| 62-14438 | 1/1987 | Japan . |
| 62-21463 | 1/1987 | Japan . |
| 63-81935 | 4/1988 | Japan . |
| 63-314838 | 12/1988 | Japan . |
| 148431 | 2/1989 | Japan . |
| 4257293 | 9/1992 | Japan . |

OTHER PUBLICATIONS

*Webster's Ninth New Collegiate Dictionary*, p. 715, Marriam–Webster Inc., 1985 ISBN 0–87779–508–8.

Primary Examiner—David E. Graybill
Attorney, Agent, or Firm—Rodman & Rodman

[57] ABSTRACT

A testing and finishing system for a discrete or combinational use of apparatus in an automated method of testing, marking, sorting and packing integrated circuit package units is disclosed.

The assembly facility comprises:
an automated loading machine feeding package units;
an environmental test station preceded by an environmental chamber that conditions the units;
a transportation means elevating the position of each unit to be processed;
an ambient temperature test station;
a unit flipper device;
a degreasing means;
a marking means;
a curing means;
a lead scanning and straightening mechanism;
and an automated binning, buttoning and packing machine.

8 Claims, 16 Drawing Sheets

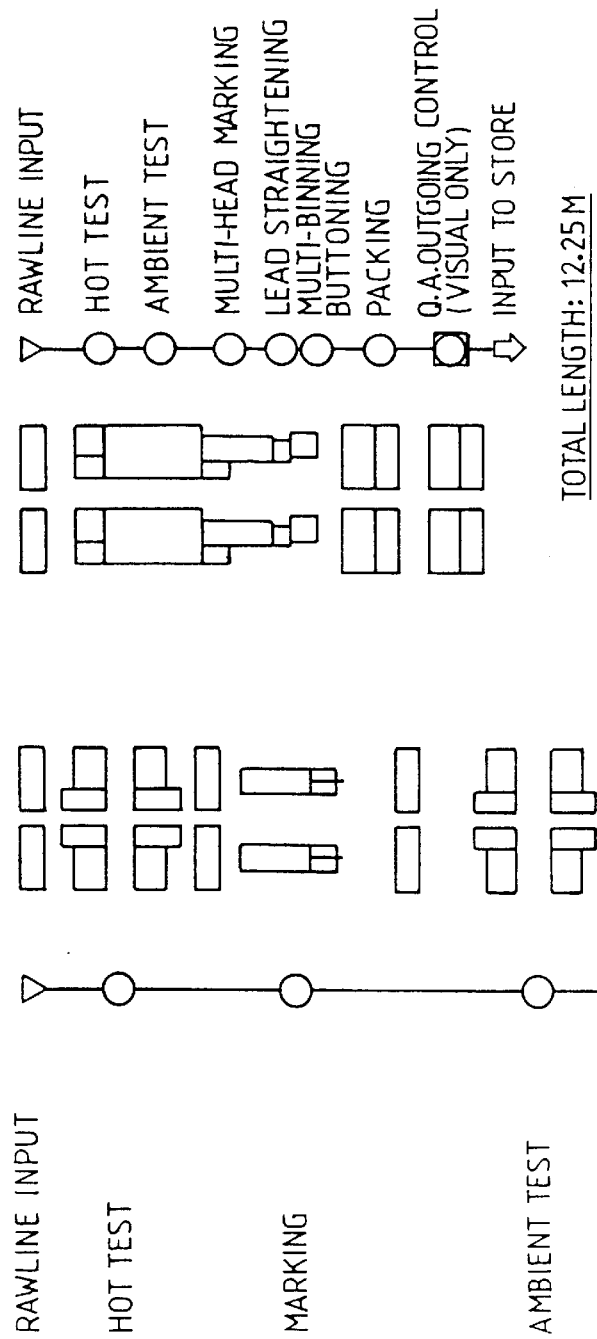
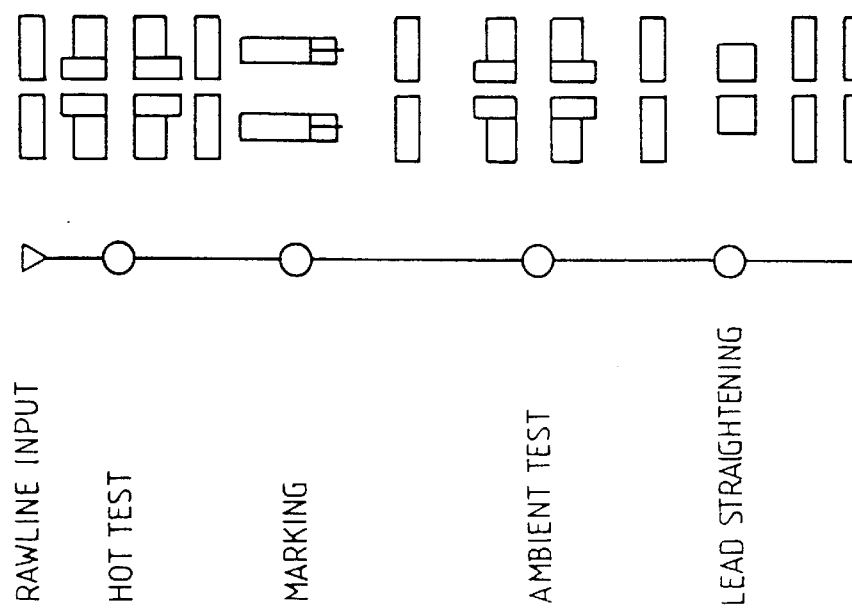
Fig. 1b
Fig. 1a (Prior Art)

TESTING AND FINISHING APPARATUS FOR INTEGRATED CIRCUIT PACKAGE UNITS

This is a continuation of application Ser. No. 07/760,869 filed Sep. 16, 1991, abandoned.

BACKGROUND OF THE INVENTION:

A wide variety of package classes have been developed for integrated circuit application. The basic requirement has been for a multi-lead (8 to 48) sealed package unit. After a package unit is fabricated, its parameters need to be compared to both the technical specifications and the customer requirements. Commercially available testing systems can be categorised as the manual or one-at-a-time systems, and those capable of quickly making automatic tests on a large number of package units. Manual testing system including switching and handling are both tedious and costly as well as being subject to more testing errors than the automated testing system.

Critical issues of testing and finishing include how to avoid package unit damage, how to avoid lead damage, how to avoid package mix-up, and how to cope with mechanical and operational consequences as a result of temperature variations.

Placing package units into elongated plastic tubes allows handler equipment to accommodate an entire class of package units in carrier such as a single tube whose outside dimensions remain unchanged for all package units in that class. Assembled package units would usually fall by gravity sequentially, and the handler equipment would deliver them to testers, sort them at output, and deliver assembled package units to tubes.

A prior art test and finishing system includes steps of a rawline input, hot test, marking, ambient temperature test, lead straightening, packing and quality assurance outgoing control. This system module involves a length of 23.93 meters. The rawline input involves a step of manual loading and unloading of plastic tubes.

SUMMARY OF INVENTION

Device handling improvement has been achieved by modifying the existing handler configuration. The present invention has integrated all individual operations in one assembly linking all the equipment and stations together forming an auto-test and finishing system.

One object of this invention is to eliminate the manual handling operations, such as loading and unloading, between equipment and stations. The chances of confusion and mixing the classes is also avoided. Another object of this invention is to shorten the cycle time of cooling from the hot test station to the ambient temperature test station.

A direct result of this integration is to save space and enhance the Just In Time concept. A reduction of manpower from five operators per shift per module to one operator per shift per module is possible.

The invention is also capable of testing and marking single or multiple binning integrated circuit package units.

An embodiment of the auto test and finish system according to the invention involves a total length of 11.95 meters, resulting in a saving of space of 11.98 meters. Loading of elongated plastic tubes with package units is done once at the beginning of the system. The package units are automatically tested, sorted, and loaded into various plastic tubes at the end of the system. There is also a saving in processing time taken.

According to the present invention there is provided a testing and finishing system for integrated circuit package units comprising the stations of:
a multi-track auto loading machine (30), representing the rawline input;
a hot chamber (50), with heated track means;
a hot tester (60)
a conveyor (80) with cooling/buffering means;
an ambient temperature tester (90);
a unit flipper mechanism (100)
a hydrogen torch degreasing mechanism (110);
a rotary marking head mechanism (130);
A vision inspection system (140), comprising a vision camera (141), and a vision monitor (142);
a ultra-violet cure chamber (160);
a lead scanning/straightening mechanism (170);
a multi-binning and buttoning machine (180), including the packing section;
and a quality assurance computer based supervisory control system.

Other and further objects, features and advantages will be apparent from the following description of a presently preferred embodiment of the invention given for the purpose of disclosure and taken in conjunction with the accompanying drawings.

BRIEF DESCRIPTION OF THE DRAWINGS

FIG. (1*a*) shows a schematic block diagram of the prior art test and finish system; FIG. (1*b*) shows a schematic block diagram of the improved system.

FIG. (2) shows a perspective view of the invention.

FIG. (3) shows a perspective view of a multi-track auto-loading station.

FIG. (4*a*) shows a package unit orientation known as a "live bug" with the leads extending downwards; FIG. (4*b*) shows a package unit orientation known as a "dead bug" with the leads extending upwards.

FIG. (5) shows a perspective view of a hot chamber illustrating the heated track means.

FIG. (6) shows a perspective view of a hot test station of the invention.

FIG. (7) illustrates package units undergoing a hot test at the hot test station as shown in FIG. (6).

FIG. (8) shows a side view of a conveyor station with cooling system.

FIG. (9) shows a perspective view of an ambient temperature test station.

FIG. (10) shows a unit flipper mechanism which turns around each unit from a dead-bug orientation to a live-bug orientation.

FIG. (11) shows a perspective view of a hydrogen torch degreasing mechanism.

FIG. (12) shows an end view of a track guide mechanism with interlock feature.

FIG. (13) shows a perspective view of a rotary marking head mechanism.

FIG. (14) shows a perspective view of a mark vision inspection system.

FIG. (15) shows a pick up mechanism for a rejected package unit.

FIG. (16) shows a ultra-violet cure station.

FIG. (17) shows a lead scanner/straightener station.

FIG. (18) shows a perspective view of a multi-binning and auto buttoning station.

DESCRIPTION OF PREFERRED EMBODIMENT

Figure 2:
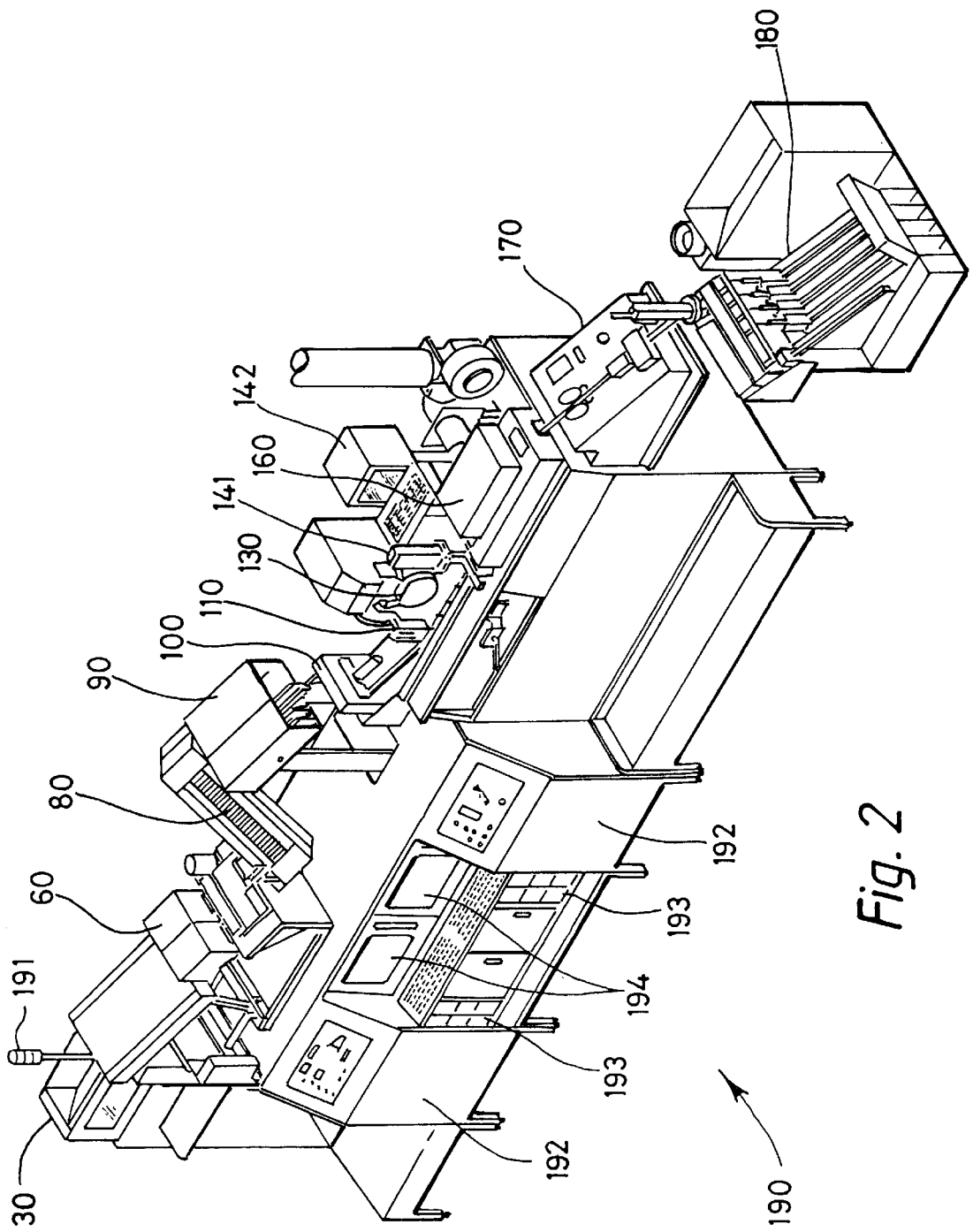
Figure 3:
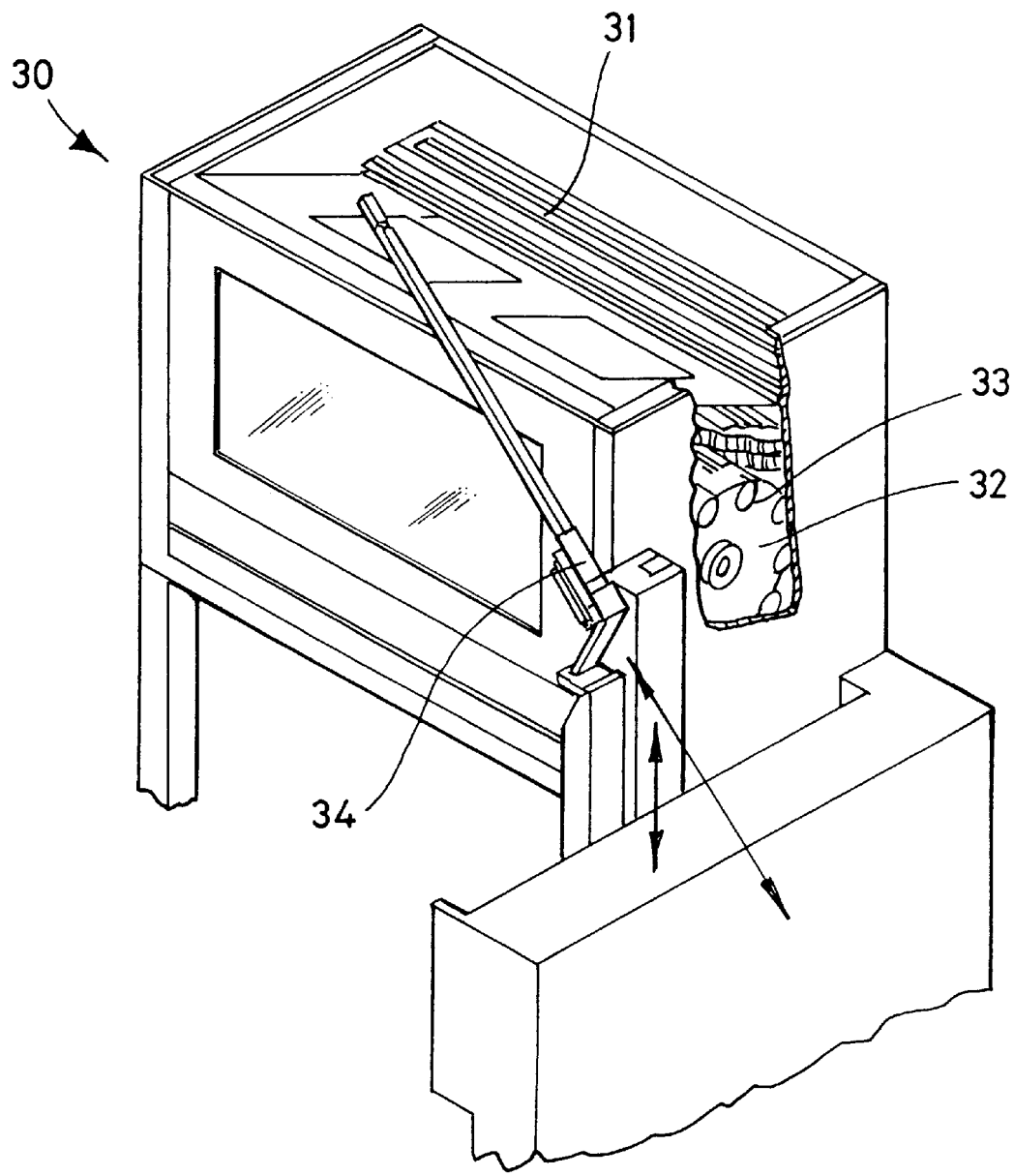
Figure 4A:
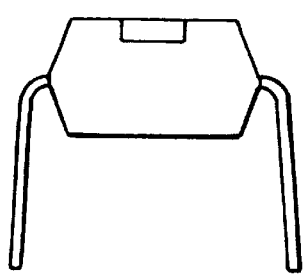
Figure 4B:
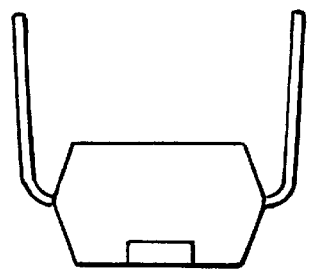
Figure 5:
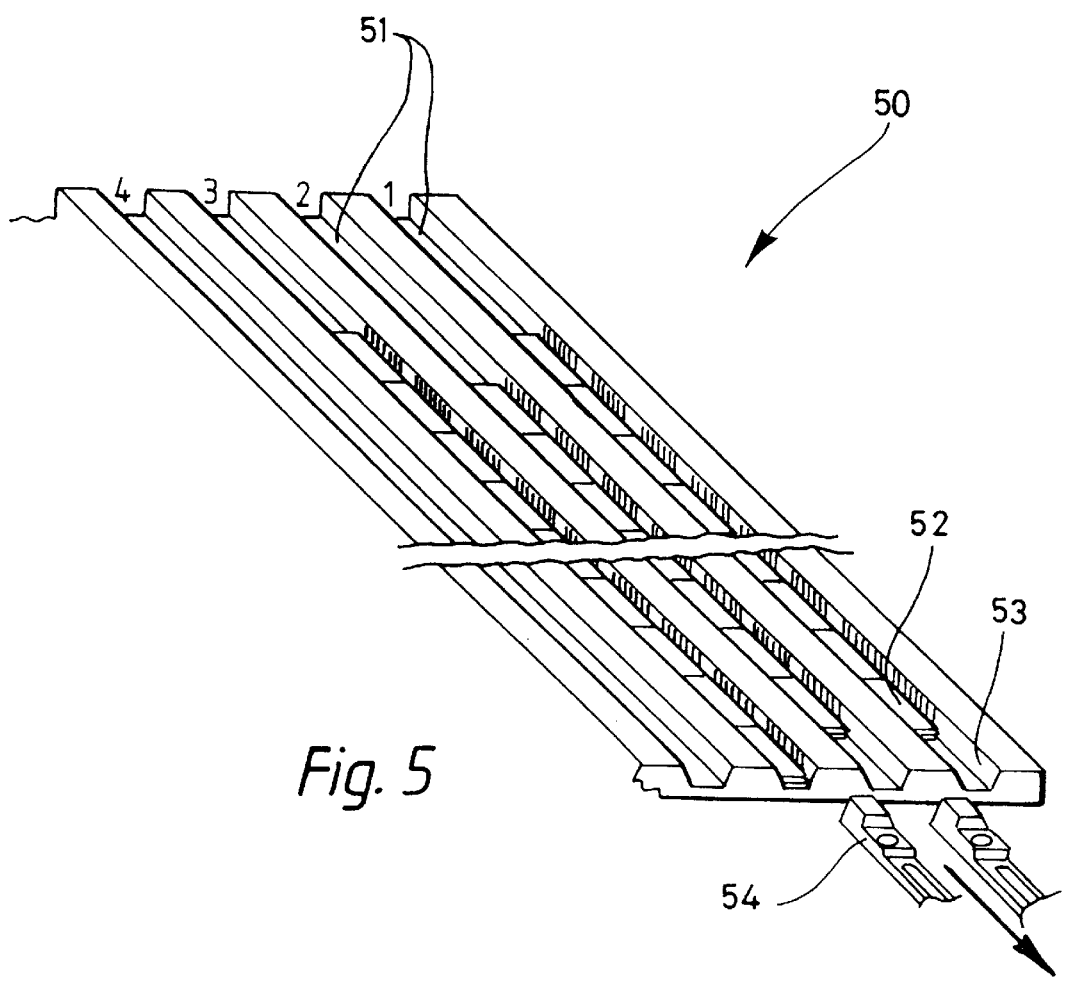
Figure 6:
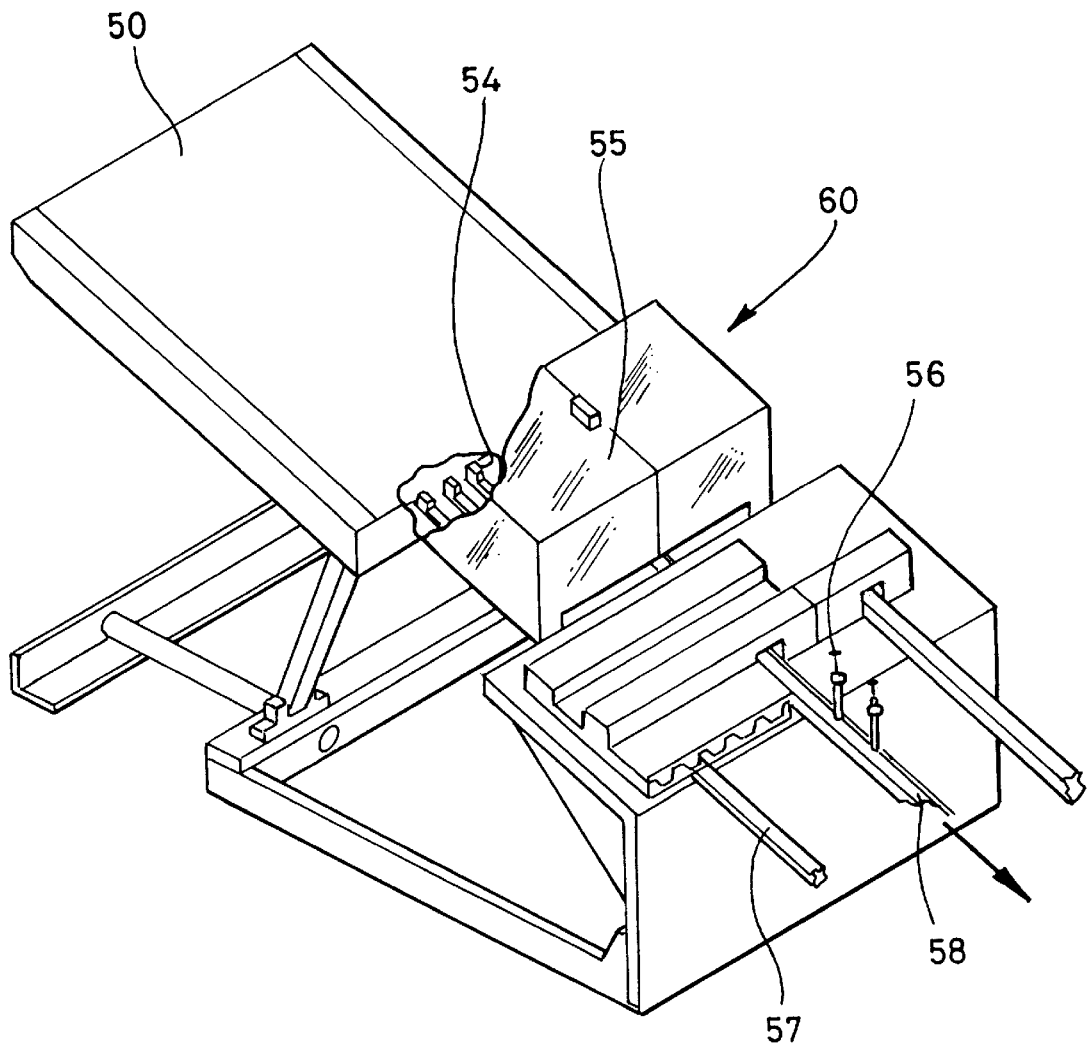
Figure 7:
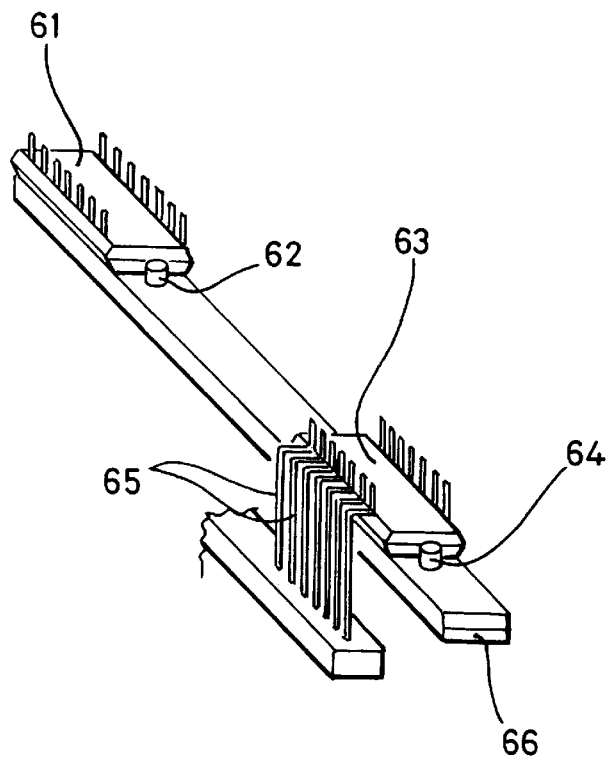
Figure 8:
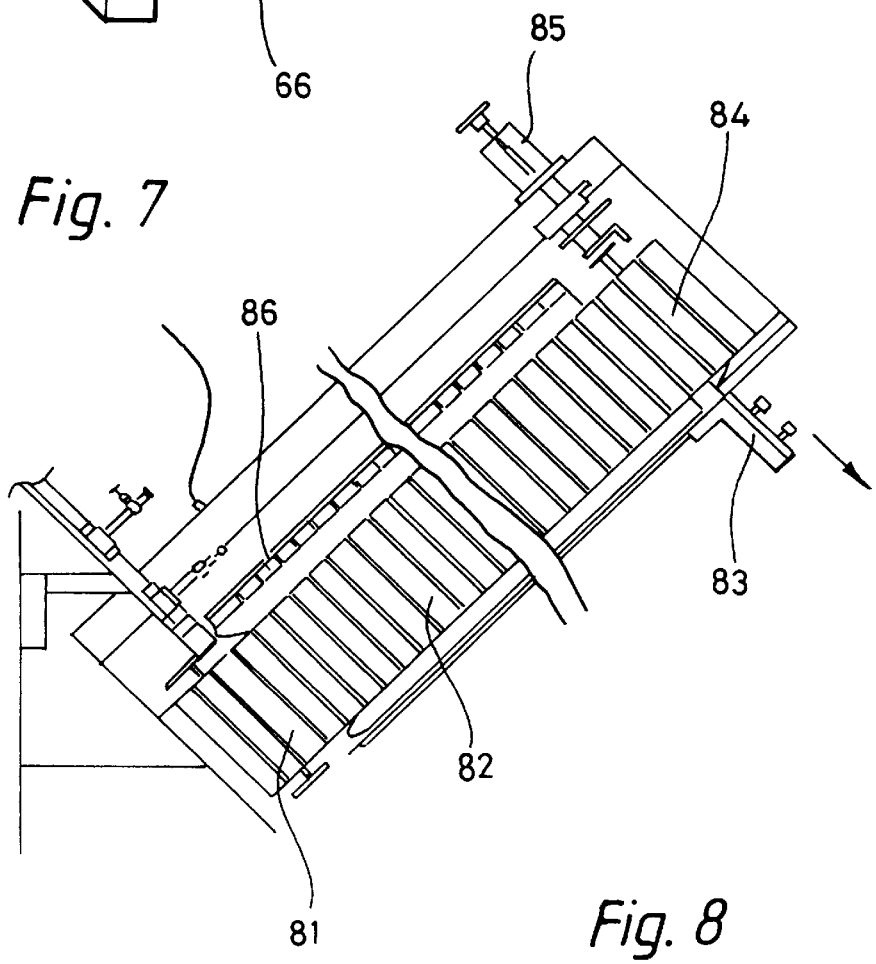
Figure 9:
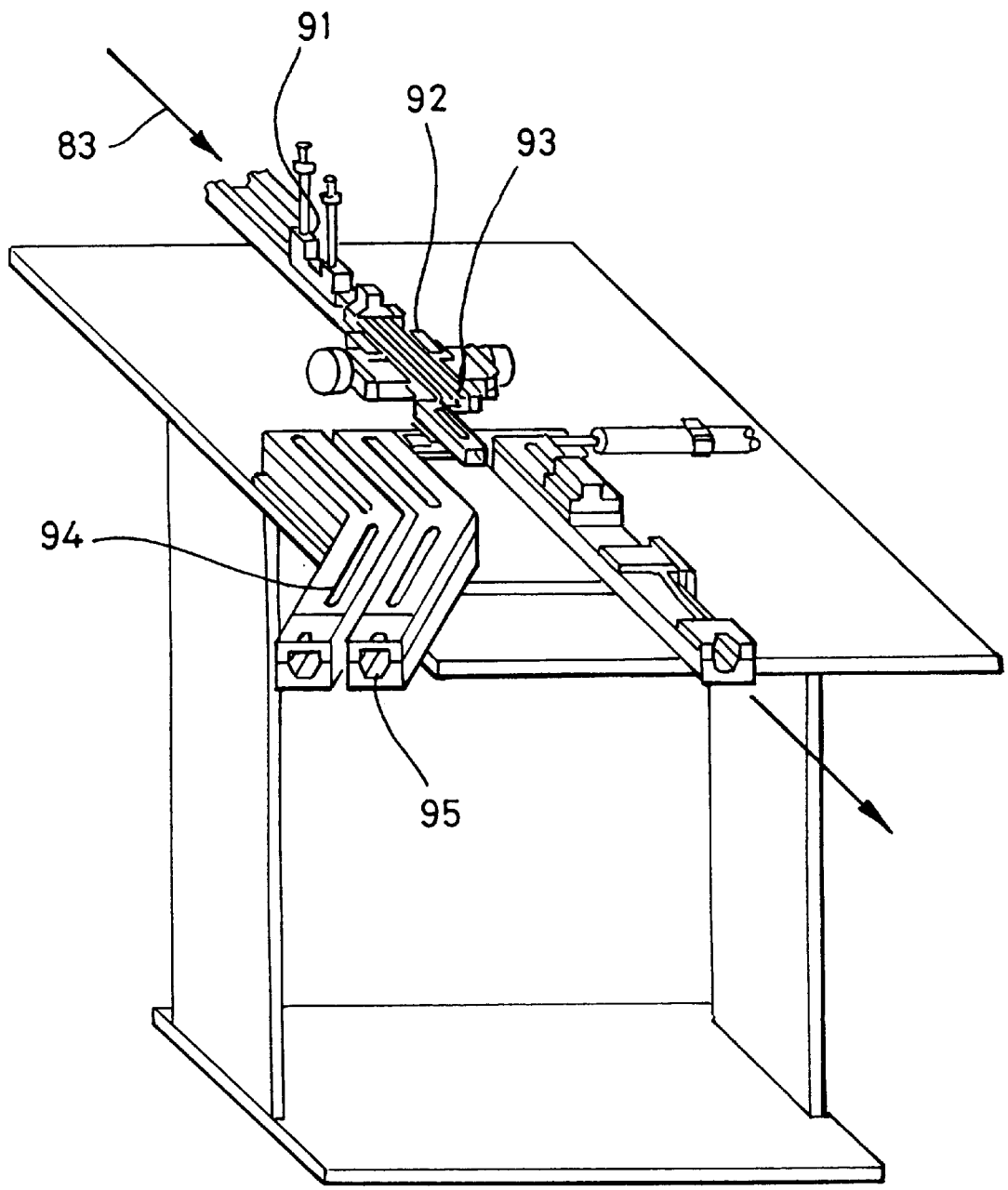
Figure 10:
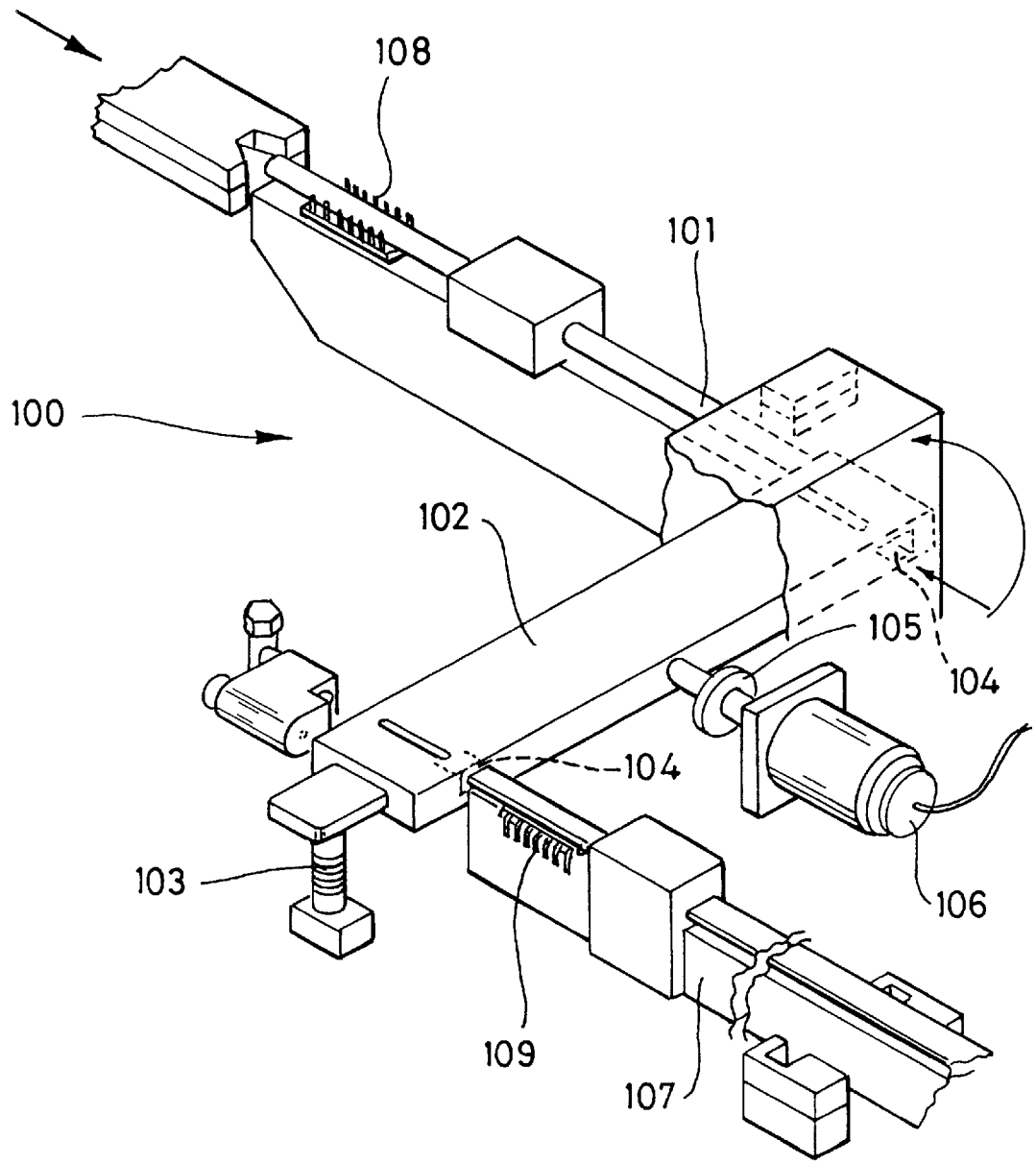
Figure 11:
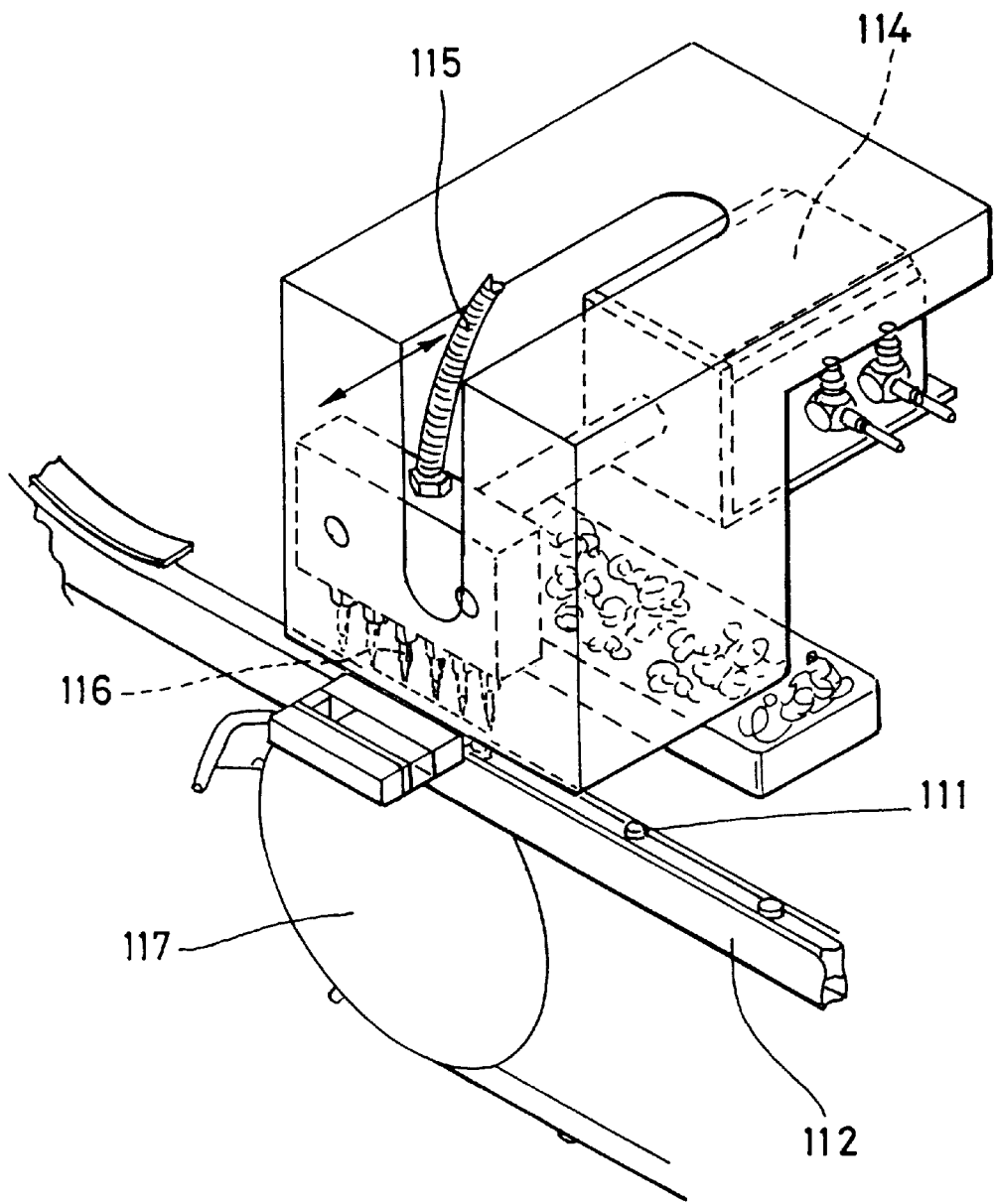
Figure 12:
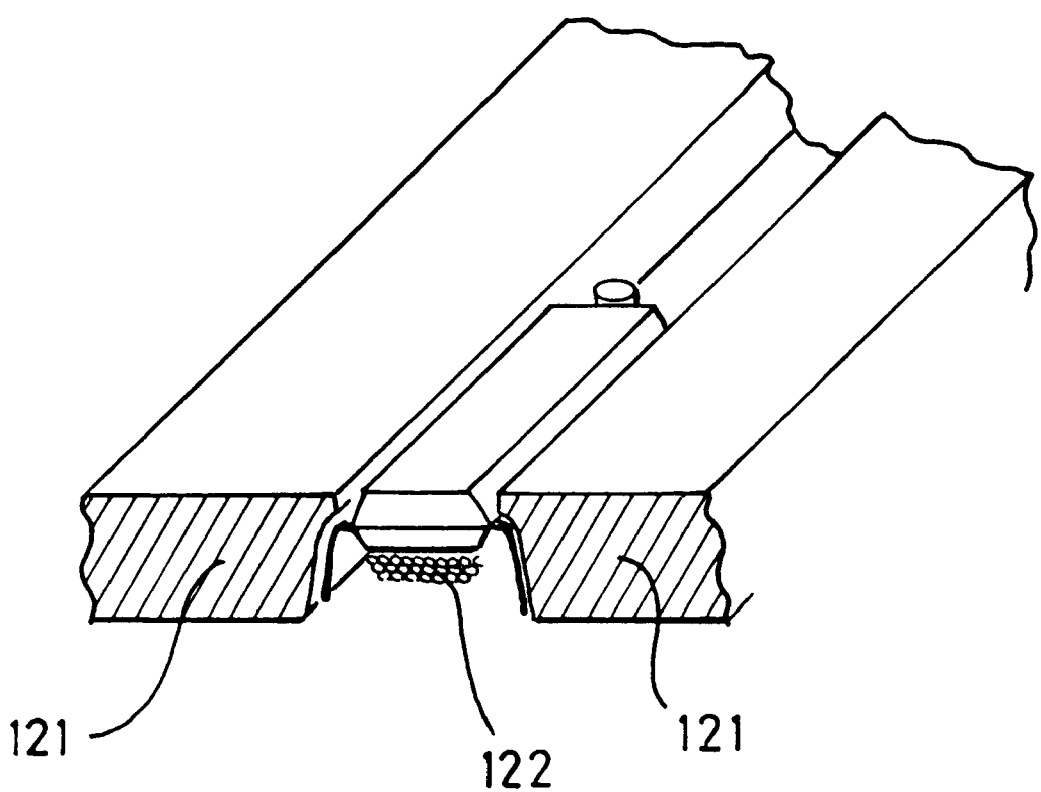
Figure 13:
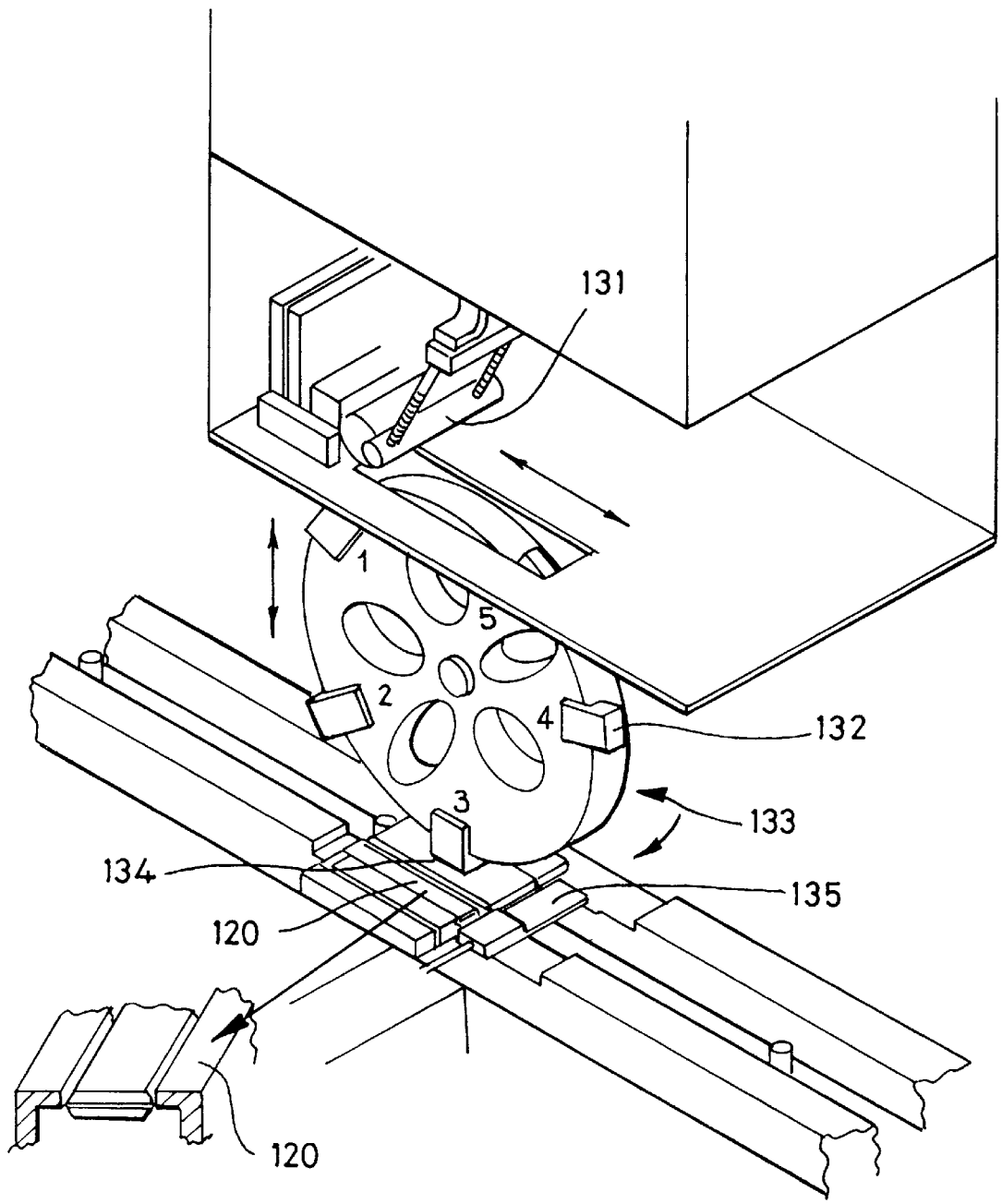
Figure 14:
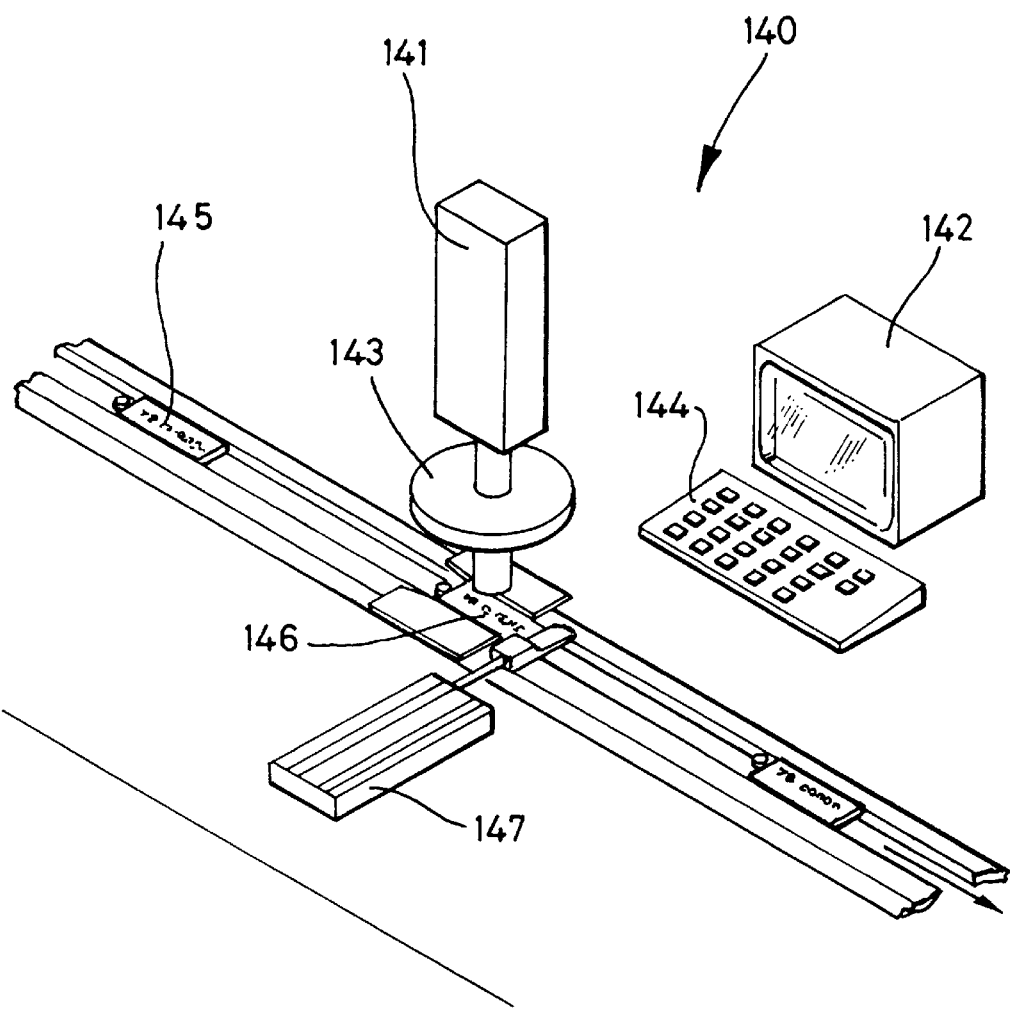
Figure 15:
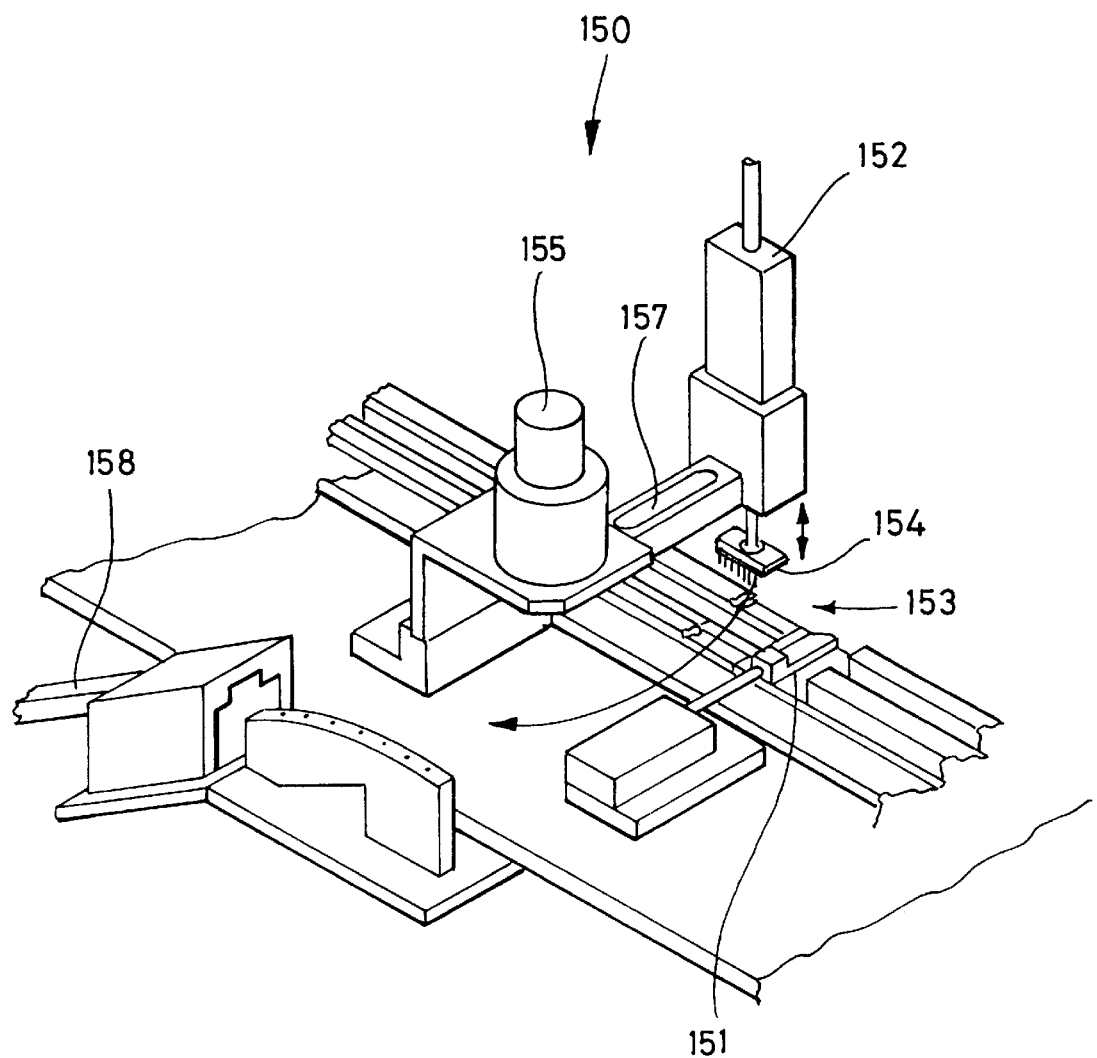
Figure 16:
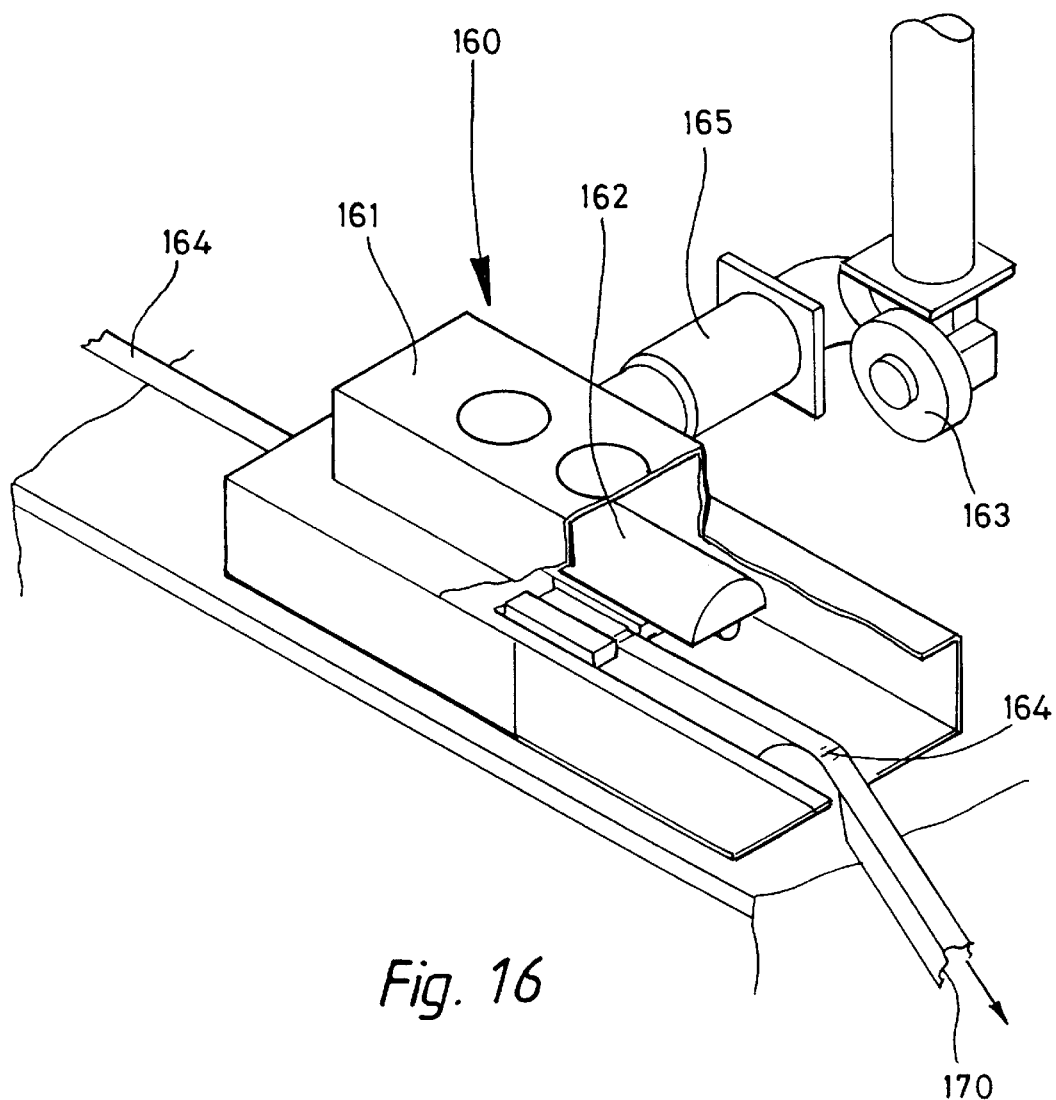
Figure 17:
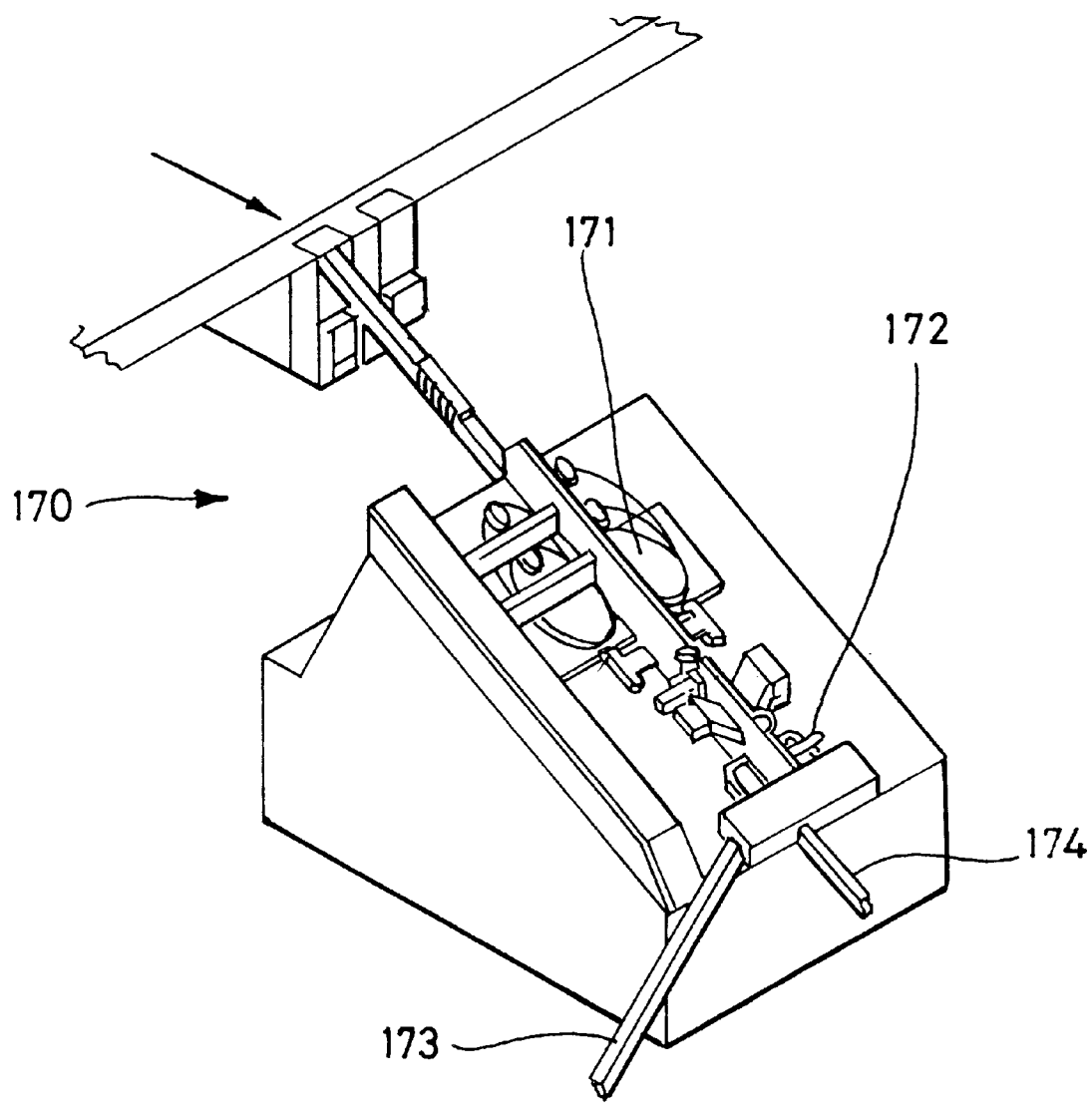
Figure 18:
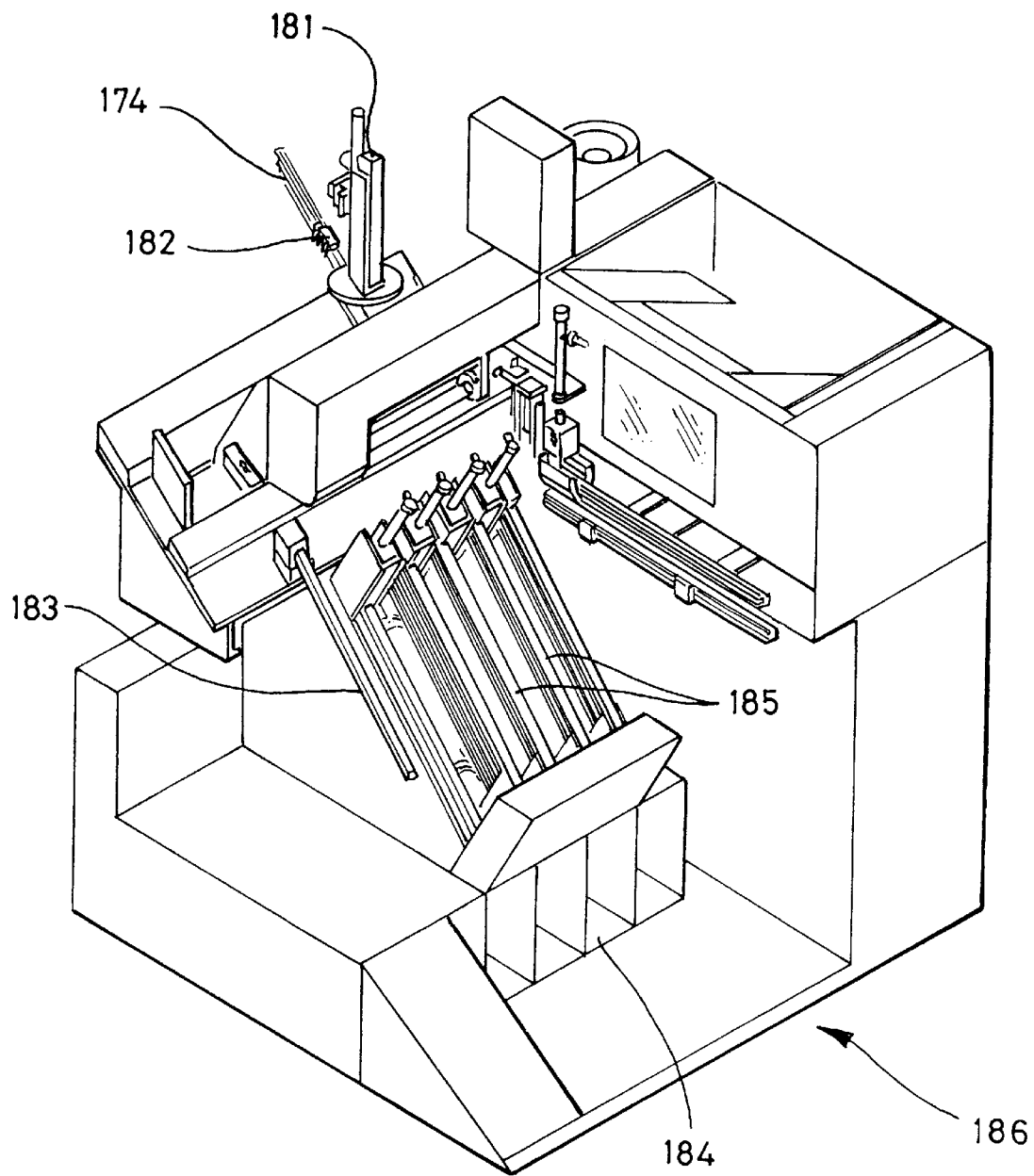

Referring to FIG. (3), a multiple track auto loading machine (30) can carry up to 200 tubes which are used as a buffer feed to the system. Each elongated tube in turn carries a number of units. For an example, for IDF 14/16L class of integrated circuit packages, the number is 25 units; for IDF 20L class of integrated circuit packages, the number is 20 units. The invention can be designed to handle different classes of the packages such as 8L or 48L plastic DIP. (width of packages to be 300 mils to 600 mils). One of the tubes is selected one at a time by a rotating drum mechanism (32) in one of its slots. As the drum mechanism (32) rotates, the tube retained in the slot at the top position is properly orientated by an actuating medium, such as a pneumatic medium, so that the integrated circuit packages inside the tube are placed in a dead-bug orientation. (FIG. 4). The multi-track loading machine (30) is slidable transversely to the direction of the units to be processed. These tubes are counter-checked by a sensor mechanism before moving them one at a time via a shuttle means (34). The shuttle means (34) picks up one loaded tube from the drum mechanism (32), moves it transversely, and then upwardly to the top of a hot chamber (50) under computer instruction. When another sensor mechanism identifies an empty track (51) in the hot chamber (50), the shuttle means (34) aligns the loaded tube with the track (51), and tilts the tube in a sloping position. Each integrated circuit package carried in the tube is fed by gravity, one by one, into the empty tracks (51) of the hot chamber (50).

Referring to FIGS. (5) and (6), in the hot chamber (50), there are preferably 13 track means (51); each track means (51) is able to take up preferably 25 units of package units. It is important to note that one end of the hot chamber (50) is at an elevated position relative to the other end, so that each unit to be processed will move by gravity towards the direction of the multi-binning system (180). The underside of the track means (51) is heated by a heating means to a pre-determined temperature. Inside this hot chamber (50), each package unit is held for a certain time period, preferably one minute. After this period, the units are selected one at a time by a shuffling means (54).

At the hot testing station (60), these units are individually tested, usually electrically, in accordance with the test specifications required. As illustrated in FIG. (7), a unit waiting to be processed (61) is stopped by a first stopper means (62). Another unit undergoing hot test (63) is restrained in position by a second stopper means (64). Test results of the heated units are communicated via test finger means (65) which will engage the leads extended from the unit under test. A heater means (66) is also included at the underside of the conveyor chain carrying the package units. The conveyor chains are covered by a hot test cover (55).

Those units that fail the test (57) are sorted and segregated. Those units that pass the test (56) are allowed to proceed on and are released down into an acceptance track slot means, where a magazine block of five units maximum is fed into a conveyor (82).

As indicated in FIG. (8), this conveyor (82) carries a plurality of magazines (81), preferably 70 in number. Each magazine (81) preferably carries five units. These magazines are transported by an externally driven conveyor (82), preferably operating at an inclined position. The driving means is preferably a motor (85). This arrangement will allow the magazines (81) to be sufficiently cooled by the time the magazines reach the top of the conveyor (82). The cooling effect is preferably achieved by air blowing through a cooling header arrangement (86) on one side of the conveyor (82). The magazines are moved upwards along the conveyor (82), until they reach a required position marked as (84), where they are released to the ambient temperature test station (90) via a sorting track means (83).

Now referring to FIG. (9), the magazines are individually selected in the sorting track means (83) by a sorter (91) and held in a queue before they are tested again at ambient temperature at the position indicated as (92). A quality assurance test program is built into the ambient temperature tester station (90) which also samples and checks the units passed. Following this ambient temperature test, these package units are sorted by a unit sorter mechanism (93). Those satisfactory units will proceed on to the unit flipper mechanism (100). Those failing the normal test or the quality assurance test are diverted to either a quality assurance reject track means (94) or a normal reject track (95).

It should be noted that a supervisory computer control system is installed to monitor and coordinate the movement of the equipment and stations. The applicant has developed a computer software program that supervise all sensor devices installed in the system, to synchronise the handling and movement of the package units, and to memorise the inspection status of each package unit.

All this while, the binning results are communicated to a marking station.

Referring to FIG. (10), a unit flipper mechanism (100) is illustrated. The function of the unit flipper mechanism (100) is to turn the passed units in a dead-bug orientation to a live-bug orientation, so that marking operation can be executed on the top surface of each unit. The mechanism (100) comprises essentially a swinging arm element (102) which is substantially rectangular. The arm element (102) is made rotatable by means of a rotating means (106) such as a motor or a pneumatic means. Near each end of the swing arm element (102) is a cavity (104) which is positioned in alignment with the entry track means (101) and the exit track means (107). The entry and the exit track means are laterally displaced and are running parallel to each other. A unit in a dead bug orientation (108) will enter the housing cavity (104) on the swing arm element (102). When the swing element (102) makes a 180 degrees swing, the unit turns into a live bug orientation (109) and leaves the cavity (104) via the exit track means (107). The unit flipper mechanism (100) includes, a sensor device that detects the presence of a package unit in the housing cavity and actuates the flipping motion, and an ejector arrangement to positively eject the package unit preferably by pneumatic means after it has been flipped into a live bug position.

The next stage of the operation is the degreasing of the units. This involves the use of a hydrogen torch means as shown in FIG. (11). This improves the ease of marking the units and the permanency of the markings. The units in live bug orientation are transported along an indexing track means (112) incorporated with indexing pin means (111). The indexing track means (112) is actuated by a pulley means (117). There are preferably six nozzle heads (116) which are placed sequentially over the top surface of the package unit. These nozzles (116) are ignited with a source of hydrogen supplied via a stainless steel tube (115). An air cylinder means (114) moves the nozzle heads (116) away from the transportation track when no degreasing is being carried out, so as not to overheat the track.

The results of the hot and cold testing stations are synchronised and memorised together with the indexed movement of the package units under computer supervisory control.

At this juncture, the units are required to be firmly gripped and held in steady position for the next stage of operation, which is the marking stage. A classification number is required to be applied to the top surface of each unit. Referring to FIG. (12), the unit in a live bug orientation is carried along on an indexing belt (122), sandwiched by two side track guides (121) preferably made from stainless steel. These two guides and the indexing belt form a shallow cavity in which the unit is carried firmly along. The track guides interlock each unit in its respective position, and the supervisory computer memorises this information with regards to its binning type of marking and visual inspection.

Now referring to FIG. (13) and for illustration only, when a unit reaches the fourth position (134) as indicated on the interlock track means (120), it is stopped by a unit stopper means (135). Directly overhead to the unit is a marking means (133). This marking means is adjustable in an up and down movement. The marking means (133) comprises preferably a rotary head means, on the outer circumference of which five marking stamp means (132) are equally spaced. Each marking means (132) carries different classification information for different package unit.

When the marking stamp means (132) is at its uppermost position, an ink transfer roller means (131) applies a thin layer of ink to the said marking stamp means (132). Under computer instruction, an appropriate marking stamp means (134) is moved to its lowest position and will mark a classification number on the top surface of each unit. After the marking operation, the unit moves along to the fifth position as indicated by (145) (FIG. (14)). When the unit is stopped at the sixth position as indicated by (146) by a pneumatic unit stopper means (147), the unit is visually inspected by a mark vision inspection system (140). Usually, a model 1100/3900 vision system is used to check the quality of the markings. Referring to FIG. (14), a vision camera (141) examines the unit placed in focus. The results are displayed in a vision monitor system (142). Computer instructions are accessible via a key board (144) linked to the supervisory computer control system (190). If the markings are not satisfactory with regards to the level of shape score, each unsatisfactory unit will be stopped by a pneumatic unit stopper (151) and picked up at the eighth indexed position as indicated as (153). As shown in Figure (15), these unsatisfactory units are re-orientated laterally by a pick up system (150). The pick up system (150) comprises preferably an elevated swing arm (157), rotatable preferably by a 180 degrees rotary pneumatic cylinder; and adapted near its end with a pneumatic picker means (152) extendable in a up and down movement.

These unsatisfactory units are fed, one at a time, into a metallic tube (158) where the unsatisfactory marks are erased, the units re-tested and remarked. Those satisfactory units proceed on and are fed to an ultra-violet chamber (160) via a conveyor belt (164) preferably made of stainless steel.

Referring to FIG. (16), the ultra-violet chamber (160) comprises an open ended enclosure (161), through which the conveyor belt (164) passes. Above the belt and inside the enclosure (161) is located an ultra-violet source means (162), preferably a lamp. To control the temperature within the enclosure (161), a ventilation means is included, consisting of preferably a sliding exhaust pipe (165) and a fan (163). The marking ink on top of each unit becomes permanently cured by the time the unit leaves the ultraviolet chamber (160). The ultra-violet chamber (160) is also made retractable from the track when no package unit is being processed.

As illustrated in FIG. (17), after the ultra-violet chamber (160), the units are then sequentially moved down a track to a lead scanning/straightening machine (170). They pass through a roller means (171) for positively forming the leads. A scanning sensor mechanism is used to detect any bent lead. Those units with excessive bent leads are sorted and segregated into reject tubes (173). Those units with slight bent leads are straightened via a pair of comb mechanism. The units with straight leads (182) proceed on and are released to the next station via the track means (174).

As illustrated in FIG. (18), a binning camera (181) is used with the said vision inspection system (140) to identify the classification number marked on the units so that each unit (182) is sorted under computer coordination to each respective binning track and the associated tube adjacent to the track.

A multiple track tube unloader unit (186) is equipped with a shuttle means which loads and stacks empty tubes already buttoned at one end into the slots which are substantially empty or short of tubes. Whenever a tube is filled with package units, each tube is finally buttoned with a plastic stopper means automatically by a buttoner machine (185). Through a rotator mechanism, the loaded tube drops into a packing box (184) placed underneath and simultaneously an empty tube is put in place.

There are preferably four buttoner machines (185) and correspondingly four packing trays, each isolated from one another.

Now referring once again to FIG. (2), the auto test and finishing system is also monitored by an alarm and three light indicator system (191), supervised by computer control. When a green light is switched on, it would indicate that all stations are running smoothly. A blinking orange light with intermittent buzzer sound would indicate that one or more stations is not running smoothly due to jamming. This is an alert signal to an operator. A red light would indicate an urgent call for technical assistance due to long jamming.

The test and finishing system is mounted on a high structure.

Positioned underneath this structure are the accessories of the supervisory computer control system and other storage compartments (193), including the tester stations (192), and terminal monitors (194). By this arrangement also, the units to be processed are kept in view by a standing inspector person.

What is claimed is:

1. A method of testing, marking, sorting and packing different classifications of integrated circuit package units (ICPUs) that are initially enclosed in carrier tubes comprising, a) automatically positioning carrier tubes containing ICPUs in a position that locates the ICPUs in a dead bug orientation, b) automatically moving the carrier tubes with the ICPUs in the previously positioned dead bug orientation to a conditioning station, c) automatically unloading the ICPUs from the carrier tubes at the conditioning station in the dead bug orientation such that the ICPUs are unenclosed, and automatically conditioning the individual, unenclosed ICPUs with heat, d) automatically transporting the conditioned ICPUs, while unenclosed and in the dead bug orientation, from the conditioning station to an environmental test station and automatically testing the electrical parameters of the conditioned ICPUs at the environmental test station while the ICPUs are in the dead bug orientation, e) automatically cooling the conditioned and unenclosed ICPUs while the ICPUs are in the dead bug orientation and automatically transporting the cooled ICPUs, while the ICPUs are unenclosed and in the dead bug orientation, from the environmental test station to an ambient temperature test station, f) automatically testing the cooled ICPUs at the ambient temperature test station for quality assurance while the ICPUs are unenclosed and in the dead bug orientation and thereafter automatically transporting the quality tested ICPUs, while unenclosed and in the dead bug orientation, from the ambient temperature test station to an orientation station, g) automatically orienting the quality tested ICPUs at the orientation station while the ICPUs are unenclosed, from the dead bug orientation to a live bug orientation and automatically transporting the ICPUs while unenclosed and in the live bug orientation from the orientation station to a degreasing station, h) automatically degreasing the ICPUs at the degreasing station while the ICPUs are unenclosed and in the live bug orientation and automatically transporting the degreased ICPUs, while the ICPUs are unenclosed and in the live bug orientation, from the degreasing station to a marking station, i) providing a set of markers at the marking station, such that each marker in the set has different classification indicia corresponding to each different classification of the ICPUs and automatically marking the degreased ICPUs at the marking station while the ICPUs are unenclosed and in the live bug orientation, with a classification indicia that corresponds to the classification of the ICPU, and automatically transporting the marked ICPUs, while the ICPUs are unenclosed and in the live bug orientation, from the marking station to an ultraviolet station, j) automatically heating the marked ICPUs at the ultraviolet station while the ICPUs are unenclosed and in the live bug orientation, using an ultraviolet source, and automatically transporting the heated ICPUs, while the ICPUs are unenclosed and in the live bug orientation, from the ultraviolet station to a lead straightening station, k) automatically scanning all the ICPUs at the lead straightening station while the ICPUs are unenclosed and in the live bug orientation, for any bent leads and automatically straightening any bent leads of the ICPUs while the ICPUs are in the live bug orientation, and automatically transporting the ICPUs, while the ICPUs are unenclosed and in the live bug orientation, from the lead straightening station to a binning, buttoning and packing station, l) at the binning, buttoning and packing station, automatically segregating ICPUs of common classification while the ICPUs are unenclosed and automatically loading the ICPUs of common classification into empty tubes that are buttoned at one end and automatically buttoning the other end of the tubes when they are loaded with ICPUs of common classification, and m) linking the conditioning station, the environmental test station, the ambient temperature test station, the orientation station, the degreasing station, the marking station, the ultraviolet station, the lead straightening station and the binning, buttoning and packing station together in a continuous cooperative assembly to permit the unenclosed ICPUs to be transported automatically from station to station and integrating all individual operations to form a completely integrated auto testing and finishing system that enables the ICPUs to be automatically transported, while unenclosed, from station to station such that the automated linking of stations eliminates manual loading and unloading of ICPUs at each station.

2. The method of claim 1 including controlling the synchronization, coordination, sequence of operation and movement of the ICPUs according to the steps (a) to (m) by computer control.

3. The method of claim 1 including moving the ICPUs, while unenclosed, by gravity through the conditioning station toward the binning, buttoning and packing station.

4. The method of claim 1 including automatically segregating the ICPUs that fail the electrical test at the environmental test station from the ICPUs that pass the electrical test and automatically moving only those ICPUs that pass the electrical test on to the ambient temperature test station.

5. The method of claim 1 including automatically flipping the ICPUs, while unenclosed, from the dead bug orientation to the live bug orientation by automatically picking up the ICPU from its dead bug orientation position and automatically swinging the ICPU 180° to the live bug orientation position.

6. The method of claim 1 wherein the degreasing step includes positioning a plurality of nozzle heads over a top surface of the ICPU and igniting the nozzles with a source of hydrogen.

7. The method of claim 1 wherein the marking step includes automatic selection and movement of one of the markers to a marking position and automatically engaging the selected marker with an ICPU that corresponds with the classification indicia of the one marker when the corresponding ICPU is at the marking station, and automatically changing the one marker to another marker when an ICPU that corresponds to the classification indicia of the other marker is at the marking station.

8. The method of claim 1 including automatic visual inspection by camera of the classification indicia marked on the ICPUs entering the binning, buttoning and packing station and sorting the visually inspected ICPUs under computer coordination to a respective binning track that corresponds to the ICPU classification.

* * * * *